United States Patent
Taguchi

[11] Patent Number: 6,148,511
[45] Date of Patent: Nov. 21, 2000

[54] ELECTRONIC COMPONENT MOUNTING MACHINE AND METHOD THEREFOR

[75] Inventor: Katsuhiko Taguchi, Chofu, Japan

[73] Assignee: Juki Corporation, Tokyo, Japan

[21] Appl. No.: 09/265,126

[22] Filed: Mar. 9, 1999

[51] Int. Cl.$^7$ .................................................. H05K 3/30
[52] U.S. Cl. ............................... 29/834; 29/739; 29/760; 29/762; 29/832; 29/842; 29/846
[58] Field of Search .......................... 29/740, 721, 741, 29/743, 759, 705, 833, 742, 834, 739, 790, 846, 832, 842

[56] References Cited

U.S. PATENT DOCUMENTS

| | | | |
|---|---|---|---|
| 5,020,964 | 6/1991 | Hyatt et al. | 414/751 X |
| 5,233,745 | 8/1993 | Morita | 29/705 X |
| 5,379,514 | 1/1995 | Okuda et al. | 29/833 X |
| 5,491,888 | 2/1996 | Sakurai et al. | 29/832 X |
| 5,495,661 | 3/1996 | Gromeret et al. | 29/740 X |
| 5,711,065 | 1/1998 | Asai et al. | 29/740 X |
| 5,729,892 | 3/1998 | Umemura et al. | 29/739 X |
| 5,743,005 | 4/1998 | Nakao et al. | 29/833 X |
| 5,761,798 | 6/1998 | Suzuki | 29/832 X |
| 5,809,639 | 9/1998 | Alvite | 29/740 X |
| 5,839,187 | 11/1998 | Sato et al. | 29/743 X |
| 5,850,683 | 12/1998 | Okazaki et al. | 29/740 X |
| 5,860,208 | 1/1999 | Nomura | 29/740 X |
| 5,894,657 | 4/1999 | Kanayama et al. | 29/740 X |

FOREIGN PATENT DOCUMENTS

| | | |
|---|---|---|
| 5-15497 | 2/1993 | Japan . |
| 9-307286 | 11/1997 | Japan . |

*Primary Examiner*—Jessica J. Harrison
*Assistant Examiner*—Binh-An Nguyen
*Attorney, Agent, or Firm*—Milbank Tweed Hadley & McCloy LLP

[57] ABSTRACT

A component mounting machine for mounting electronic components onto a plurality of circuit boards in high speed with a simple structure is disclosed. The electronic component mounting machine includes a board conveyer section which has first and second positioning areas, where the first positioning area is movable in the Y direction, and a plurality of transport units, each unit having a plurality of component pick-up units and being movable independently in the X direction on a same X-guide.

3 Claims, 9 Drawing Sheets

6,148,511

ELECTRONIC COMPONENT MOUNTING MACHINE AND METHOD THEREFOR

BACKGROUND OF THE INVENTION

1. Field of the Invention

The present invention relates to an electronic component mounting machine and method therefor, and more particularly to an electronic component mounting machine and method therefor in which the components are fed sequentially from an electronic component storage section, picked up by pick-up nozzles, and mounted onto predetermined positions on printed circuit boards.

2. Description of the Related Art

In electronic component mounting machines, electronic components are generally supplied one at a time from a reel having a paper or plastic tape containing the electronic components to a component feeder, then the components are picked up by a head unit, and then the components are mounted onto a printed circuit board. The head unit is generally moved in XY directions on a plane parallel to the circuit board by means of an XY robot. One example is shown in FIG. 10.

Referring to FIG. 11, the head unit 4 has generally one or more component pick-up units 7, and is supported on the XY robot 6 via a mechanical interface member 8. The component pick-up unit 7 has a structural member 9 fixed on the surface of the interface member 8, a bracket 11 movable up and down along a vertical straight guide 10 supported on the structural member 9, a z-motor 13 for driving the bracket 11 in up-and-down direction via a ball screw 12 mounted on the bracket 11, a pick-up nozzle 15 attached at the lower end of a vertical shaft 14 mounted on the bracket 11, a θ-motor 16 mounted on the bracket 11 for controlling the angular position of the pick-up nozzle 15 by rotating the shaft 14 about its axis, a position detector 18 mounted on the structural member 9 for detecting the position of an electronic component picked up by the pick-up nozzle 15, and a camera 19 mounted on the structural member 9 for recognizing marks on the circuit board 5, the pick-up position on the component 17 at the time of picking up the component 17, and the position of the component 17 mounted on the circuit board 5.

By matching the distance between the pick-up nozzles 15 on the pick-up units 7 with the distance between the top ends of the feeders 3, a plurality of pick-up units 7 can pick up a plurality of components 17 simultaneously, and the same number of picked up components 17 as the number of pick-up nozzles 15 can be placed on the board 5 simultaneously at each XY movement by the XY robot 6, and hence the mounting time of the components 17 can be shortened.

In one configuration, a component mounting machine having an X guide rail on which two head units are mounted independently movable to each other is disclosed, where the components picked up by both heads are placed onto respective predetermined positions on two boards independently positioned from each other. As the number of pick-up units increases with respect to the XY robot, the cycle time of picking up and mounting the components is theoretically reduced, which improves productivity. A problem with this method is that productivity might be reduced relative to the increase of the number of pick-up units because the increase in number of pick-up units necessarily increases the transportation mass for the XY robot, and it may become difficult to maintain the moving speed and acceleration of the units, which sometimes results in longer cycle time of picking up and mounting the components.

In another configuration, a component mounting machine has a head unit that is moved only in an X direction (transporting direction of the board) and the board is moved in a Y direction perpendicularly thereto is disclosed. A problem with this configuration is that the machine occupies a large installation area and has difficulty in attaining high speed operation.

In still another configuration the component mounting machine comprises two beams in the X direction, each having a head unit mounted thereon is disclosed. A problem with this configuration is that component storage sections have to be provided in front and rear sides of the machine, which means a complicated structure, higher cost for a production line, and higher cost of the machine.

In still another configuration, a component mounting machine comprising an X rail having two head units is disclosed. A problem with this configuration is that after mounting a component on one side of a board, the X rail has to be moved in a Y direction, and then the other component may be mounted onto the other side of the board. Therefore, the mounting cycle time is longer.

Thus, as demonstrated by the foregoing problems, there exists a need for an electronic component mounting machine and method therefor for mounting electronic components at high speed without increasing installation area of the machine and its cost with a simple structure.

SUMMARY OF THE INVENTION

In order to solve the problems mentioned above, the invention provides for an electronic component mounting machine and method therefor. In an apparatus aspect of the invention, the invention comprises a board conveyer section for transporting and stopping circuit boards through a board carry-in area, a plurality of board positioning areas and a board carry-out area, an electronic component storage section disposed along the board conveyer section for supplying electronic components sequentially, a head unit having pick-up nozzles, each pick-up nozzle for receiving the component from the component storage section and placing it onto the board positioned at the board positioning area, and component pick-up units, each pick-up unit including an angular positioning device for the nozzle, and an XY robot for supporting and moving the head unit in an X direction parallel to transporting direction of the boards and in a Y direction perpendicular thereto. The head unit has a plurality of transport units supported slidably on one X-guide, each transport unit being independently movable relative to at least one other in the X direction and having at least one component pick-up unit, and at least one of the board positioning areas can be moved and positioned in the Y direction relative to the other board positioning areas.

In a method aspect of the invention, the invention comprises the steps of positioning a plurality of transport units in an X direction with independent movement of the units in the X direction, each unit having at least one pick-up unit including a pick-up nozzle, positioning a plurality of positioning areas with respective boards thereon with independent movement in a Y direction, positioning an angular orientation of each picked up component by an angular positioning device of the pick-up nozzle, and placing the components onto the boards.

In another aspect of the invention, the head unit has a plurality of transport units supported slidably on one X-guide, and at least one of the board positioning areas can be moved and positioned in Y direction relative to other board positioning areas. Therefore, when the components are mounted on plural boards simultaneously, the displacement of both X and Y directions between the plural boards can be easily corrected. In this arrangement, electronic components can be mounted on boards in high speed. And, since the transport units are supported on one same guide, the invention can be simplified to a smaller size.

DETAILED DESCRIPTION OF THE DRAWINGS

Embodiments of the invention will be described hereunder with reference to the accompanying drawings.

Figure 1:
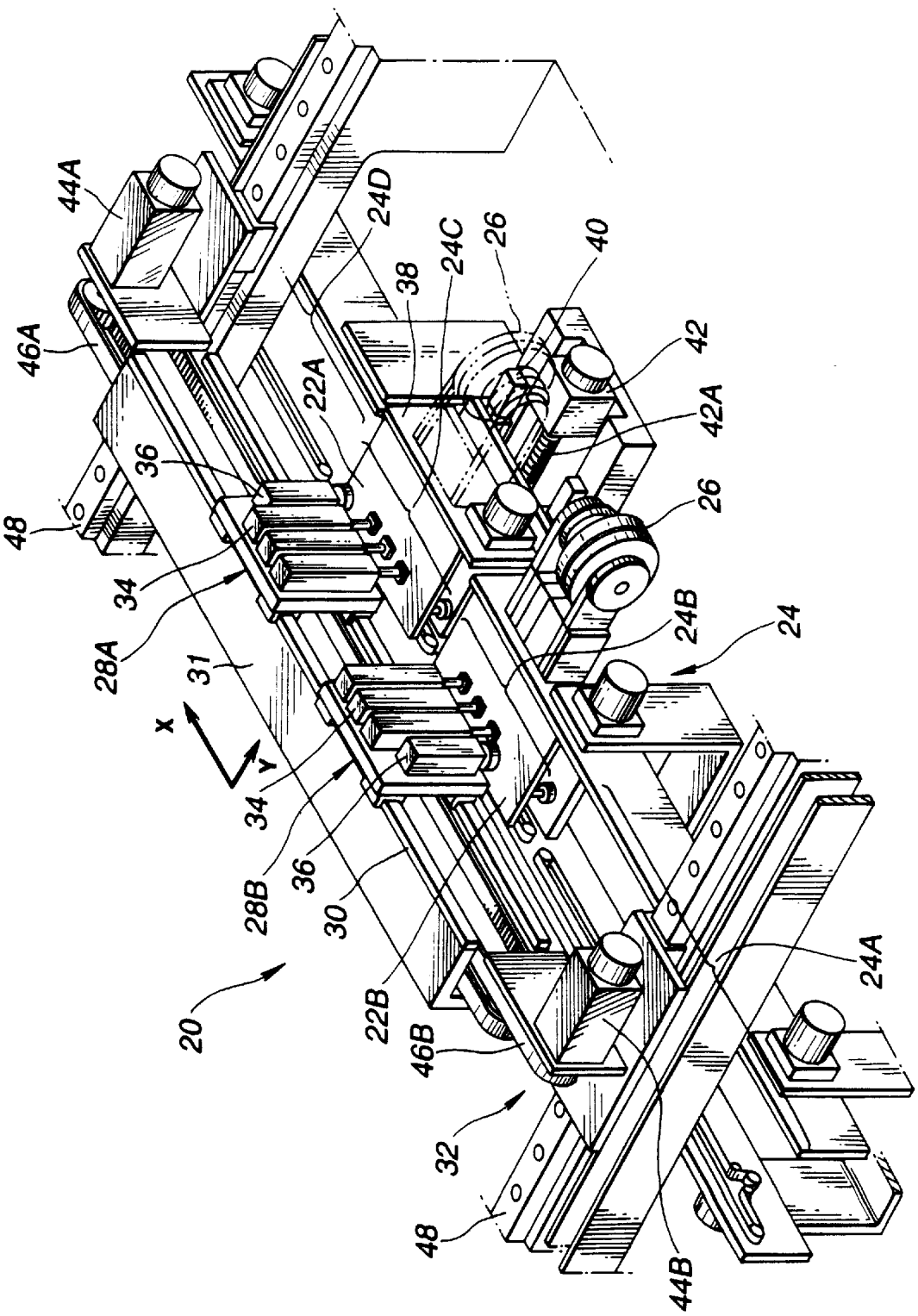
FIG. 1 is a perspective view of a component mounting machine embodying an aspect of the invention.

FIG. 1 shows a perspective view of a component mounting machine 20 embodying one aspect of the invention. The machine 20 comprises a board conveyer section 24 for transporting and stopping boards 22A, 22B in one direction (X direction), the first positioning area 24C and the board carry-out area 24D, an electronic component storage section 26 disposed along the board conveyer section 24 for supplying electronic components sequentially, a pair of transport units 28A and 28B for receiving respective components from the component storage section 26 and mounting them onto the boards 22, and an XY robot 32 having an X-guide 30 for supporting the transport units 28A and 28B which are slidably movable in X direction in parallel with the transport direction of the boards 22, and driving the X-guide 30 in the direction Y perpendicular thereto. Numerals 44A and 44B designate transport motors for driving the transport units 28A and 28B via belts 46A and 46b, respectively, along the X-guide 30. Both ends of a X-direction beam 31 together with the motors 44A and 44B are supported on a Y-direction guide 48 of the XY robot 32, and are slidably movable in the Y direction driven by a motor (not shown).

Figure 2:
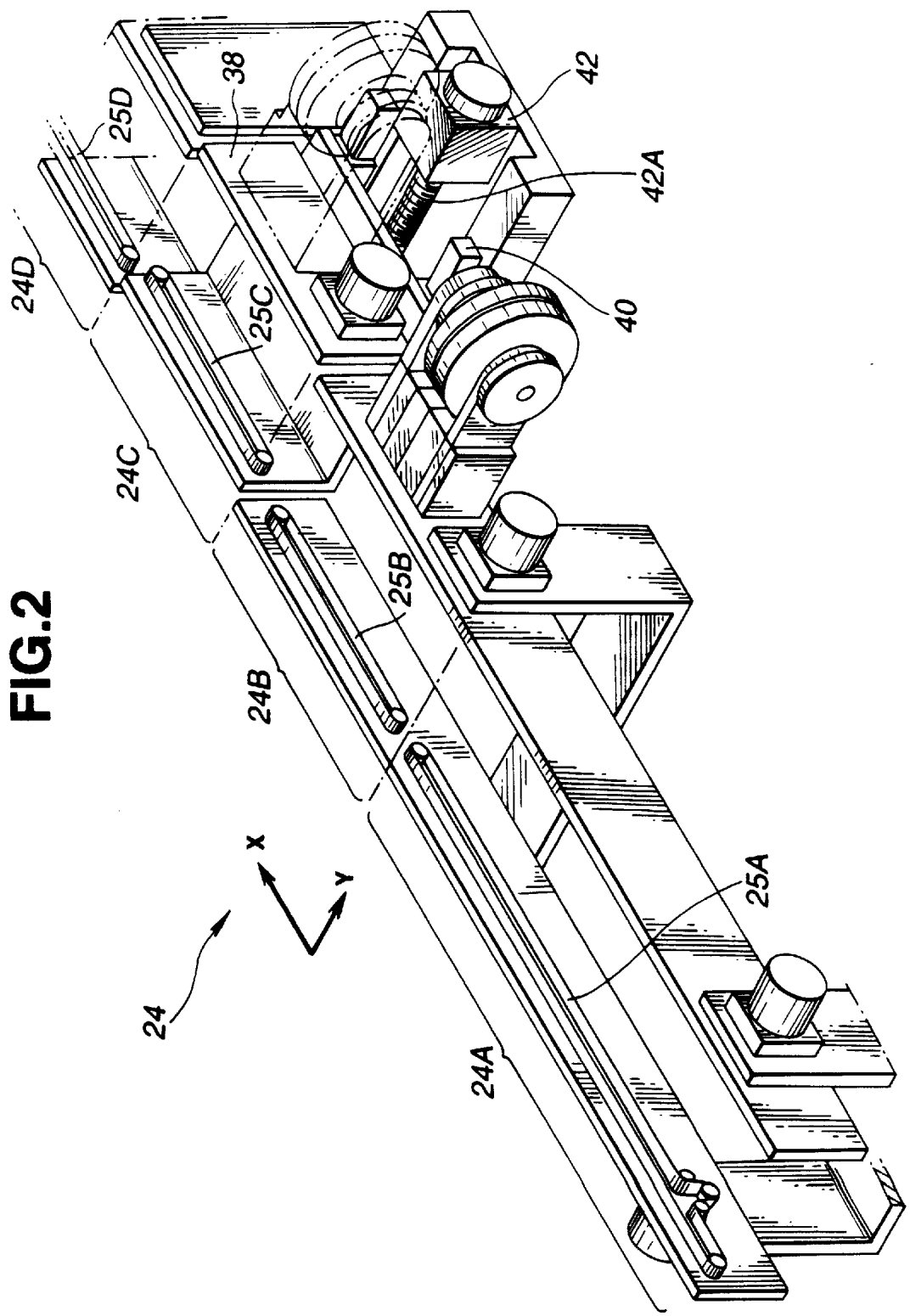
FIG. 2 is an enlarged perspective view showing one embodiment of a board conveyer section.

FIG. 2 shows an enlarged perspective view of one embodiment of the board conveyer section 24, which has, sequentially in the board transporting direction, a board carry-in area 24A, a second positioning area 24B, a first positioning area 24C, a board carry-out area 24D, and conveyers 25A through 25D, each of which can independently transport and stop the boards 22. The boards 22A and 22B are positioned at the first and second positioning areas 24C, 24B, respectively, so that the respective components can be placed on the boards by two transport units 28A, 28B.

As shown in FIGS. 1 and 2, one embodiment of the first positioning area 24C has a U-shaped frame 38, which supports the conveyer 25C and are supported movable horizontally in Y direction along a Y-direction straight guide 40 through a ball screw 42A driven by a Y-motor 42.

Figure 3:
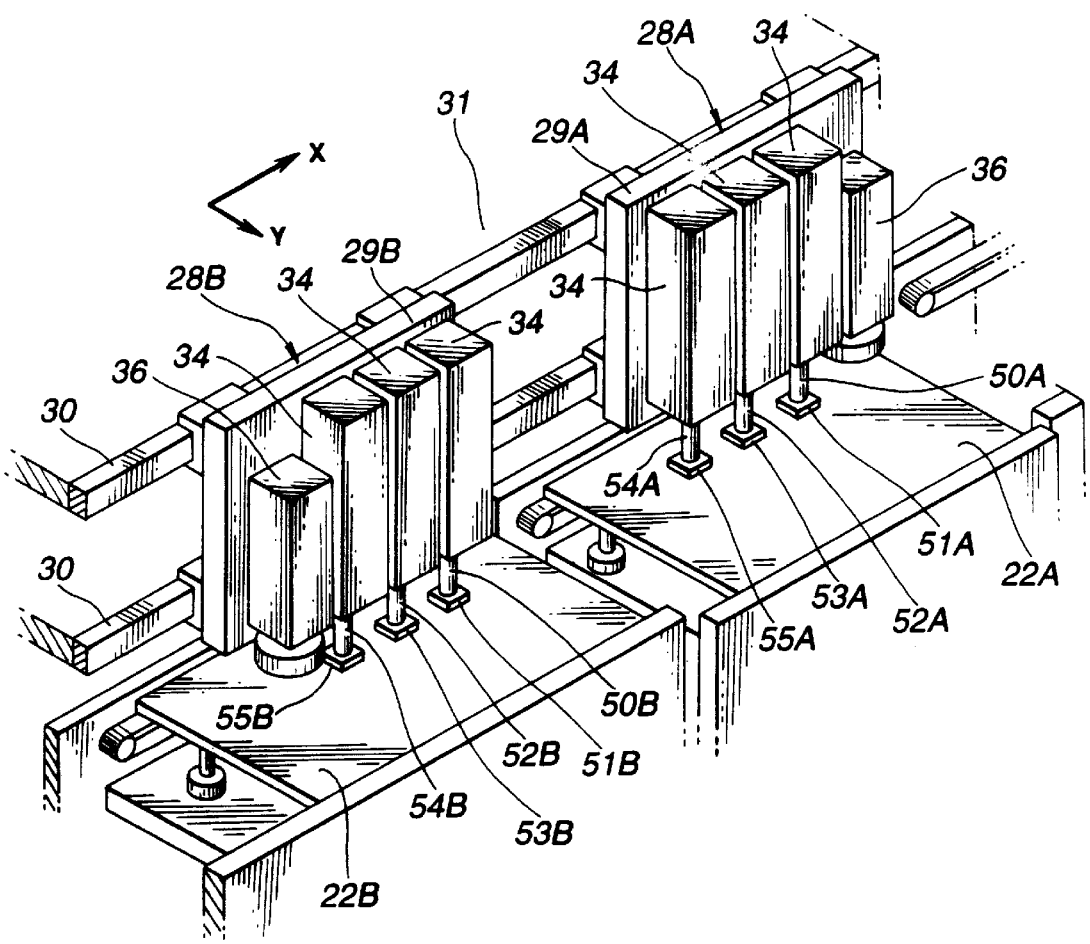
FIG. 3 is a perspective view illustrating one embodiment of the relationship between a head unit and circuit boards.

FIG. 3 shows one embodiment of each of the transport units 28A and 28B which have three pick-up units 34, and a camera 36 (position detectors are not shown). The transport units 28A and 28B are supported on the X-guide 30 via mounting plates 29A and 29B working as mechanical interface members. The component pick-up units 34 on the transport units 28A and 28B have respective pick-up nozzles 50A, 52A and 54A and 50B, 52B and 54B, which angular positions are controlled by the rotation of their respective shafts about their axes by respective motors.

One embodiment of the process of mounting components on the boards 22A and 22B using the component mounting machine 20 will be explained in detail with reference to the drawings FIG. 4 through FIG. 9.

Figure 4:
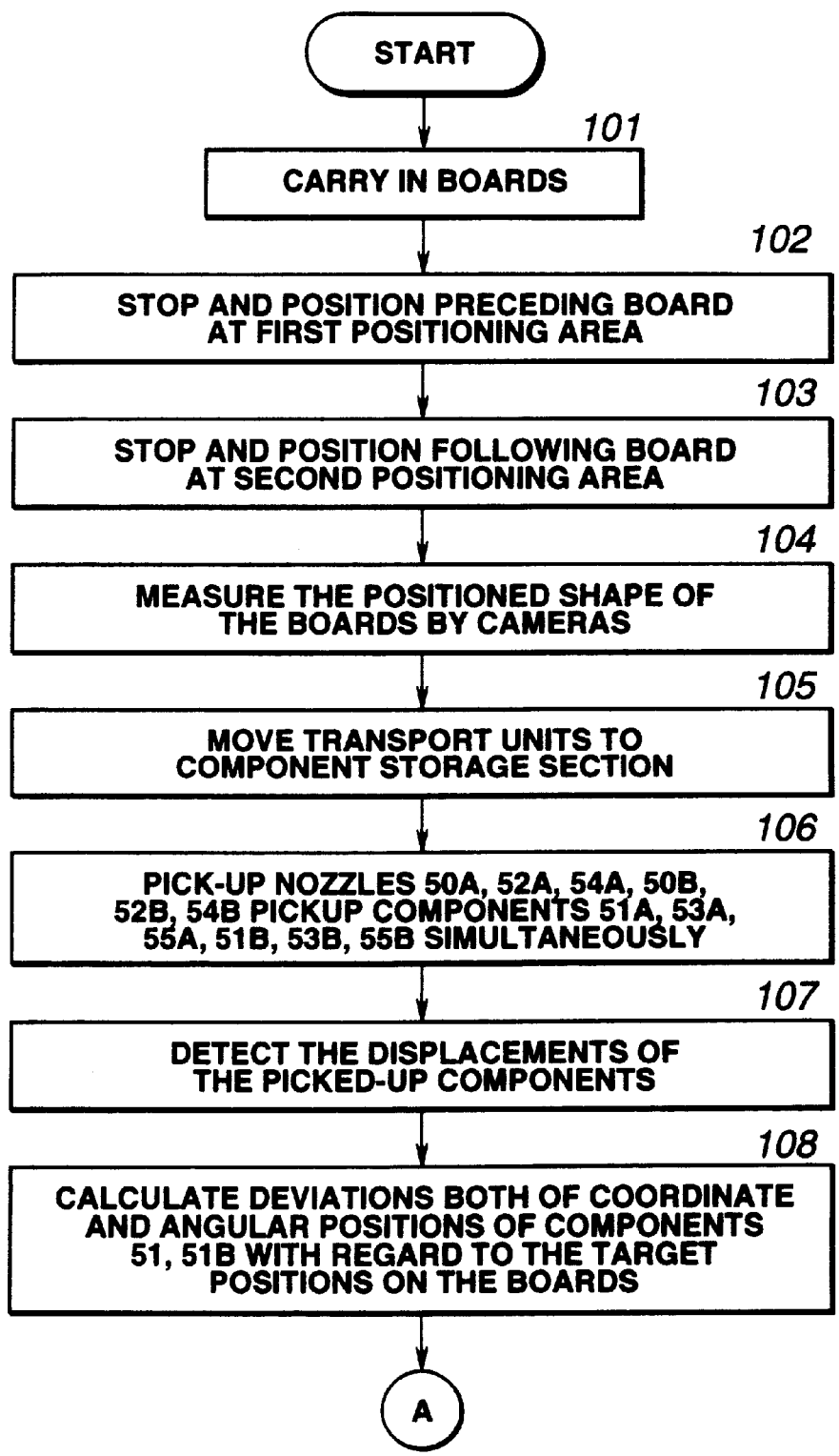
FIG. 4 is a flow chart showing one embodiment of the former half of the component mounting process in the component mounting machine.

As shown in FIG. 4, one embodiment of the process begins at step 101, where the boards 22A, 22B are carried in the board conveyer section 24 from the board carry-in area 24A. Then at step 102, the preceding board 22A is stopped and positioned at the first positioning area 24C, and the following board 22B is transported to the second positioning area 24B and positioned at step 103. At this time, the camera 36 captures the positioned shape of the boards 22A and 22B and are measured their positions at step 104. Then at step 105, the XY robot 32 moves the transport units 28A and 28B to the pick-up position of the components at the component storage section 26. At step 106, the pick-up nozzles 50A, 52A and 54A and 50B, 52B and 54B pick up respective components 51A, 53A and 55A and 51B, 53B and 55B simultaneously. Because the picked up components are usually more or less shifted and/or tilted with regard to their nozzle centers, these displacements must be corrected. As to the nozzle disposition, nozzles 50A and 50B, 52A and 52B, and 54A and 54B are aligned in the same Y coordinate positions, respectively. Before the correction, at step 107, both coordinate position and angular orientation of each component are detected by the position detector. Then at steps 108 through 112 (see FIG. 5), the deviation in X, Y direction and tilting angle are calculated and corrected so that the components 51A and 51B can be simultaneously mounted on the boards 22A and 22B by the nozzles 50A and 50B respectively. In more detail, first at step 108, the deviation in X, Y direction and angular orientation of each of the components 51A and 51B with regard to target positions (positions A and B in FIGS. 6–9) are calculated, based on the distance between the target positions on the boards 22A and 22B for the components 51 and 51B, and the picked up shape of the components 51A and 51B detected by the position detectors.

Figure 5:
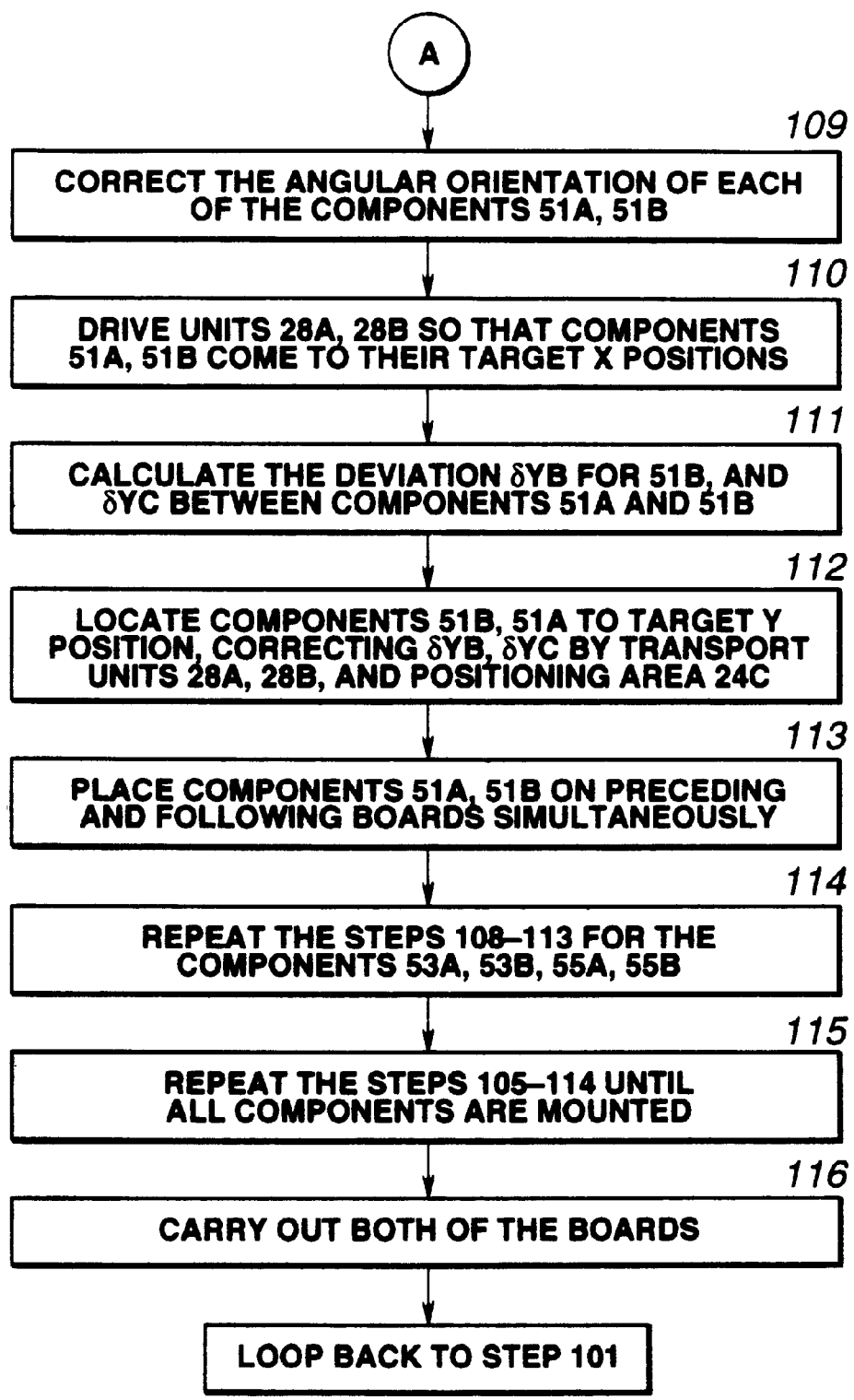
FIG. 5 is a flow chart showing one embodiment of the latter half of the component mounting process in the component mounting machine.
Figure 6:
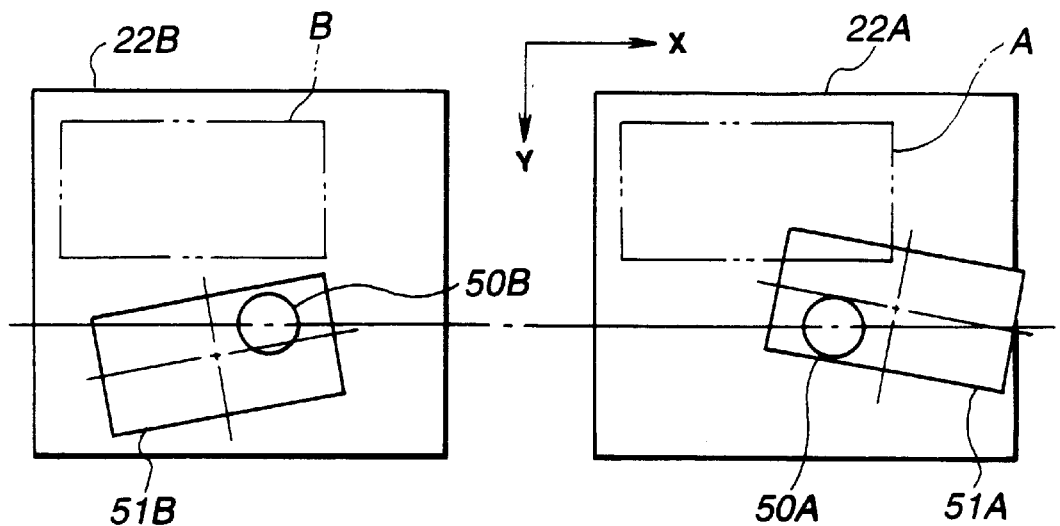
FIG. 6 is a plan view showing one embodiment of the positional relationship between the boards and the components to be mounted at the time of picking up components in mounting process.
Figure 7:
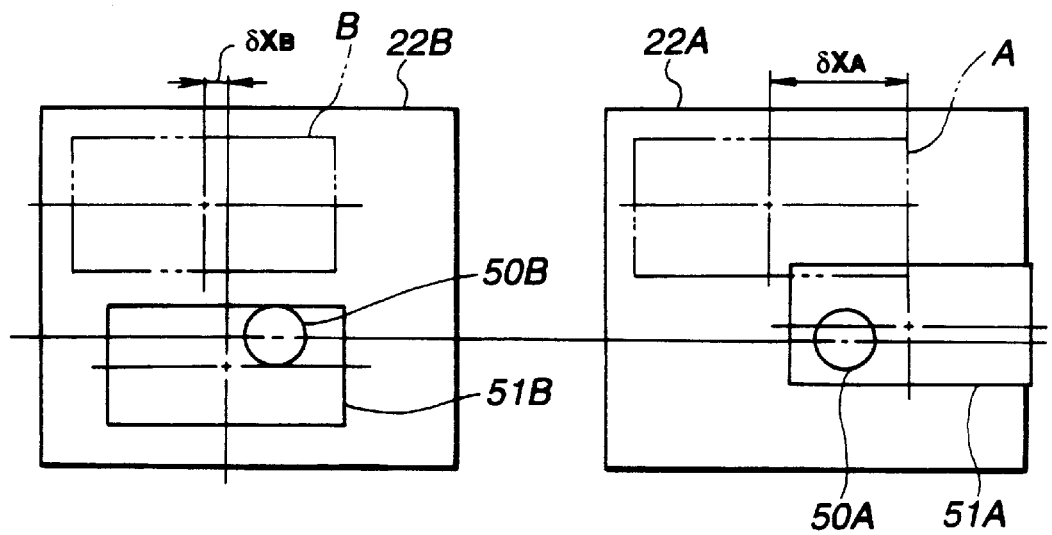
FIG. 7 is a plan view showing one embodiment of the positional relationship between the boards and the components after correction of the angular orientation of each component in mounting process.
Figure 8:
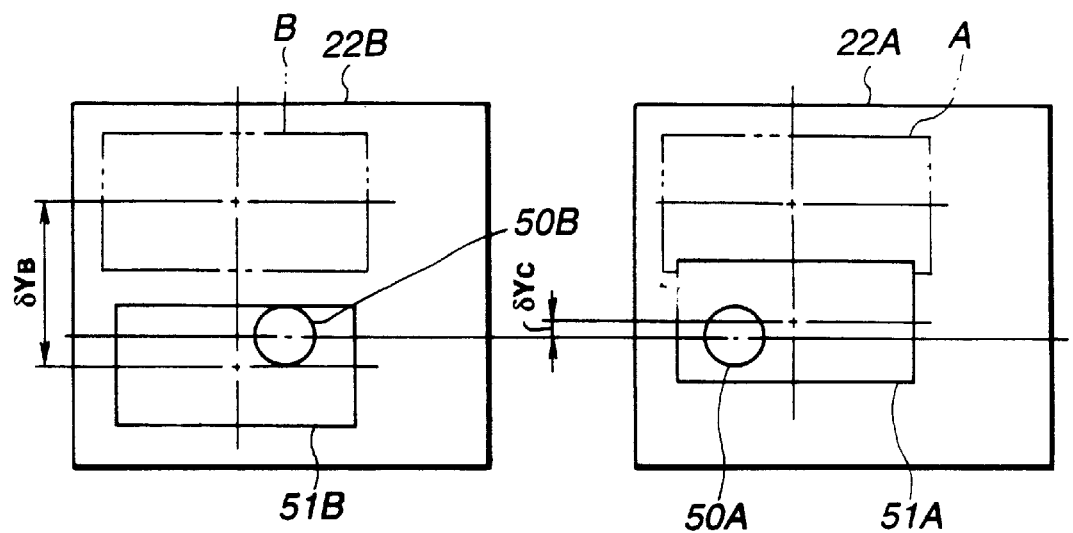
FIG. 8 is a plan view showing one embodiment of the positional relationship between the boards and the components after correction of X direction coordinate of each component in mounting process.
Figure 9:
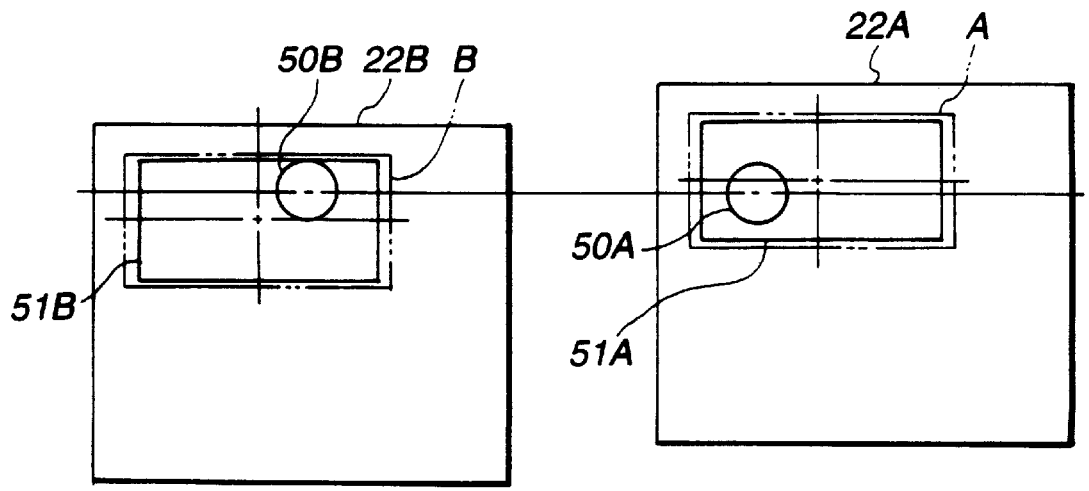
FIG. 9 is a plan view showing one embodiment of the positional relationship between the boards and the components after corrections both of angular and coordinate positions of each component in mounting process.
Figure 10:
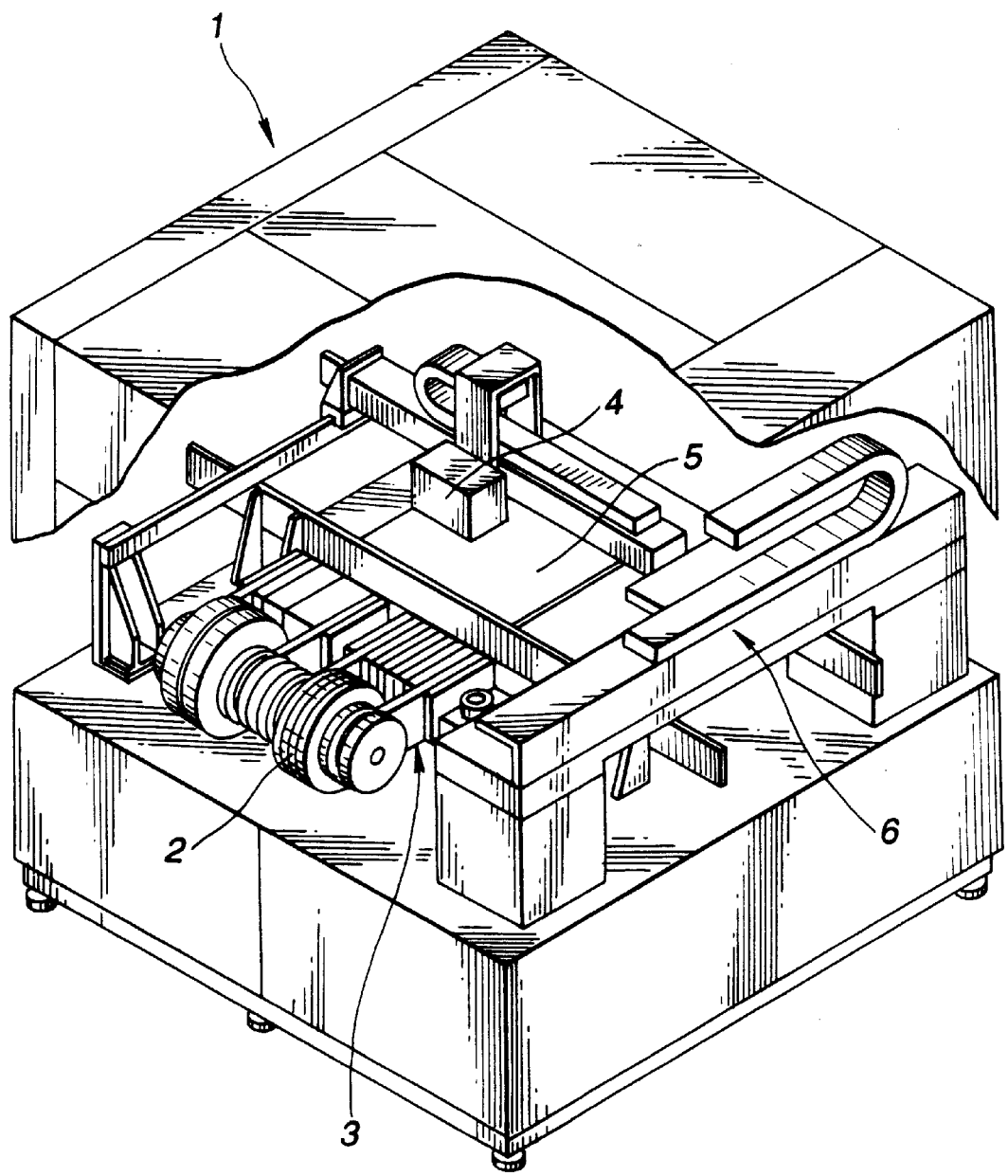
FIG. 10 is a schematic perspective view showing a conventional component mounting machine.
Figure 11:
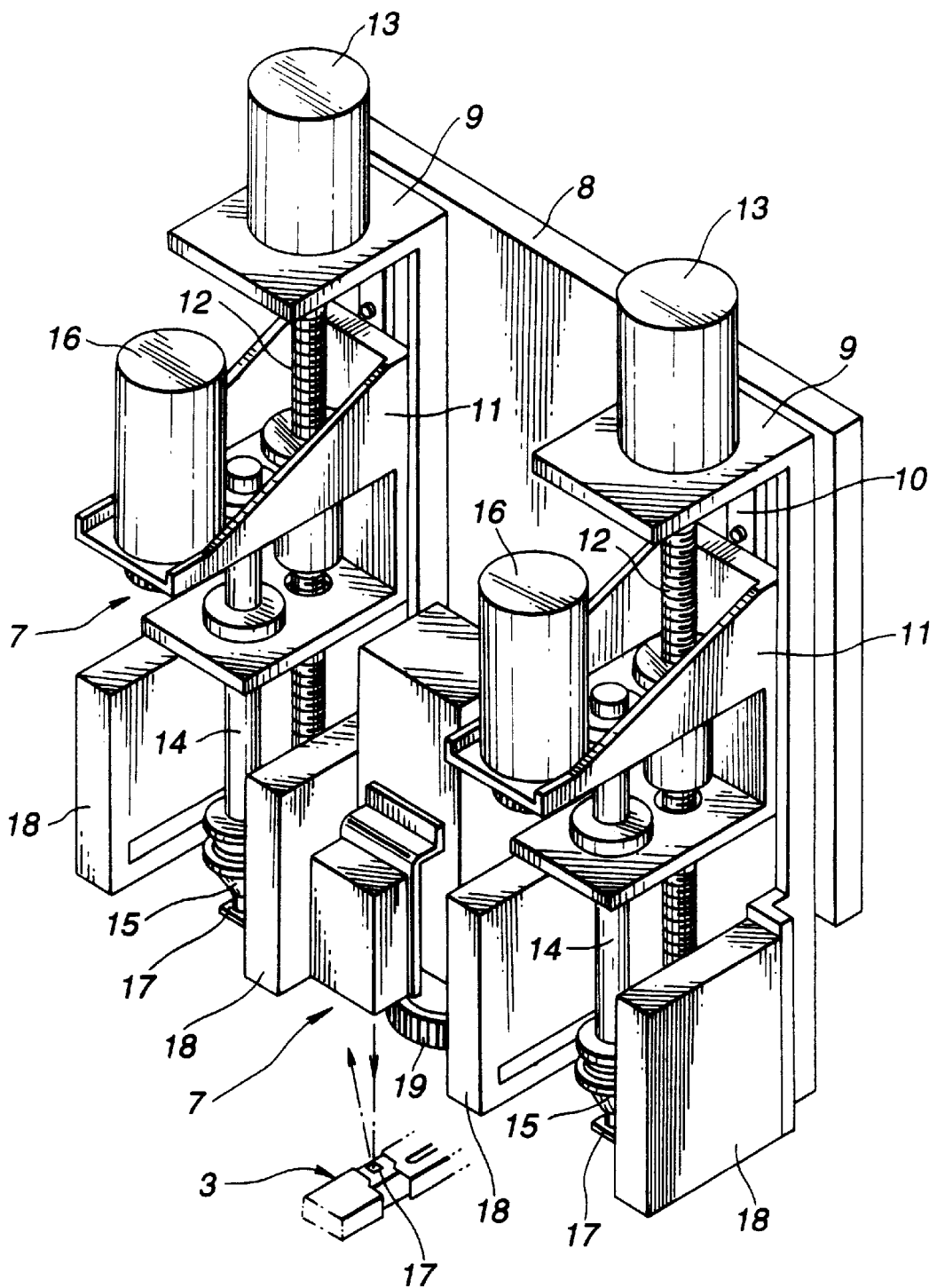
FIG. 11 is an enlarged perspective view showing a head unit of a conventional component mounting machine.

Referring to FIG. 5, at step 109, the nozzles 50A and 50B are rotated to correct the tilted angles of the components 51A and 51B to the predetermined orientations (see FIG. 7). At step 110, the XY robot 32 drives and positions the transport units 28A and 28B in X direction through the mechanical interface members, plates 29A and 29B so that the deviations in X direction δ XA and δXB between the picked up components 51A and 51B and the respective target positions on the boards 22A and 22B can be corrected (see FIG. 8). At step 111, it is calculated the deviation δYB between the component 51B and the predetermined Y coordinate position, and the Y direction deviation δYC between the picked up components 51A and 51B. Then at step 112, the transport units 28A and 28B are moved in Y direction by δYB by the robot 32 to coincide the component 51B with the target position B in Y direction. At the same time, the first positioning area 24C with the board 22A including the frame 38 is moved in Y direction by δYC by the Y-motor 42 to coincide the component 51A with the target position A in Y direction (see FIG. 9). After the positional correction, the components 51A and 51B are placed on the respective boards 22A and 22B simultaneously by the respective pick-up nozzles 50A and 50B at step 113. At step 114, the steps 108 through 113 explained before are repeated for mounting the components 53A and 53B and 55A and 55B. Further, at step 115, the steps 105 through 114 are repeated until all components to be placed are mounted on the boards. After mounting all components to be placed on the boards, the boards 22A and 22B are carried out through the board carry-out area 24D at step 116, and the process can loop back to the step 101.

While two transport units are provided in the described embodiment, the invention is not limited to this case, but more than three units can be provided. The number of component pick-up units on each of the transport units is not also to be limited to three units, but can be at least one unit.

As to the board conveyer section in the embodiment, the number of positioning areas is the same as those of the transport units, but these numbers can differ to each other. It is adaptable if the position areas are arranged movably in a Y direction relative to a plurality of transport units. Therefore, such structures can be employed that all transport units are movable by means of ball screws or the like, or only one transport unit is fixed with other units being movable in a Y direction.

In the embodiment described above, the components are sequentially mounted on the two boards 22A and 22B simultaneously, but the invention is not limited to the embodiment. It is possible in such a manner, for example, that each of the transport units 28A and 28B mounts the components covering each half zone of the preceding and following boards in the board traveling direction. In other words, the transport unit 28A could mount components onto the front half zones of the boards 22A and 22B, and the unit 28B onto the rear half zones of the boards 22A and 22B. In another embodiment, the XY robot 32 is driven by motors, but these motors could include linear motors.

As explained above, the present invention provides a component mounting machine in which a plurality of electronic components can be mounted onto a plurality of boards simultaneously with a simple structure in high speed. The present invention has been described with respect to particular illustrative embodiments. It is to be understood that the invention is not limited to the above-described embodiments, and that various changes and modifications may be made by those of ordinary skill in the art without departing from the spirit and scope of the appended claims.

What is claimed is:

1. A machine for mounting electronic components on circuit boards comprising:
   a board conveyor section for conveying in a transporting direction and stopping a plurality of circuit boards through a board carry-in area, a plurality of board positioning areas, and a board carry-out area arranged in this order;
   an electronic component storage section disposed along the board conveyor section for supplying electronic components sequentially;
   a plurality of component pick-up units, each pick-up unit having a pick-up nozzle for receiving one of the components from the component storage section and placing it onto one of the boards placed on one of the board positioning areas, and an angular positioning device for the nozzle;
   a plurality of movable transport units, each transport unit having at least one of the component pick-up units and a camera for measuring the position of one of the boards on one of the positioning areas;
   board drive means for moving and positioning at least one of the board positioning areas independently relative to the other positioning areas in a Y direction perpendicular to an X direction parallel to the board transporting direction, the board positioning areas being arrayed along the X direction; and
   an XY robot for moving an X guide in the Y direction, the X guide slidably supporting along a Y coordinate the plurality of transport units which are independently movable to an X coordinate in the X direction;
      wherein a first one of the transport units is movable in the X and Y directions for positioning a first one of the components to be mounted above a first target position on a first one of the boards on a first one of the positioning areas, and a second one of the transport units is movable independently of the first transport unit in the X direction for positioning a second one of the components to be mounted above the X coordinate of a second target position on a second one of the boards on a second one of the positioning areas, the Y coordinate of the second transport unit being determined by and identical with the Y coordinate of the first transport unit, and the board drive means capable of moving the second positioning area with the second board thereon independently and substantially simultaneously of the first positioning area in the Y direction to position the second component above the Y-coordinate of said second target position.

2. The machine as claimed in claim 1, wherein the XY robot is driven by linear motors.

3. A method for mounting components using an electronic component mounting machine comprising the steps of:
   conveying and stopping a plurality of circuit boards through a board carry-in area, at least a corresponding plurality of board positioning areas, and a board carry-out area;
   measuring each board position on each of the board positioning areas by a camera;
   picking up components from a component storage section by pick-up nozzles;
   transporting transport units, each having the pick-up nozzles, in X and Y directions;
   rotating each picked up component if necessary for mounting that component onto a predetermined position on one of the boards;

and substantially simultaneously mounting the picked up components on the plurality of boards placed on the plurality of board positioning areas;

wherein positioning a first transport unit, with movement in the X and Y directions, above a first target position on a first board determines a Y coordinate of a second transport unit, the Y coordinate of the second transport unit being the same as of the first transport unit; and wherein the second transport unit is positioned above a second target position on a second board by moving the second transport unit independently of the first transport unit in the X direction and moving the second board independently of the first board in the Y direction to the Y-coordinate of said second target position so that said picked up components of first and second transport units are positioned above Y-coordinates of said first and second target positions.

\* \* \* \* \*